United States Patent [19]
Metzler et al.

[11] Patent Number: 5,825,079
[45] Date of Patent: Oct. 20, 1998

[54] SEMICONDUCTOR DIODES HAVING LOW FORWARD CONDUCTION VOLTAGE DROP AND LOW REVERSE CURRENT LEAKAGE

[75] Inventors: Richard A. Metzler, Mission Viejo; Vladimir Rodov, Redondo Beach, both of Calif.

[73] Assignee: Luminous Intent, Inc., Costa Mesa, Calif.

[21] Appl. No.: 787,627

[22] Filed: Jan. 23, 1997

[51] Int. Cl.$^6$ ............ H01L 29/06; H01L 31/0352; H01L 29/76; H01L 29/94
[52] U.S. Cl. ............................. 257/653; 257/393
[58] Field of Search .................... 257/653, 393

[56] References Cited

U.S. PATENT DOCUMENTS

| | | |
|---|---|---|
| 3,407,343 | 10/1968 | Fang . |
| 3,458,798 | 7/1969 | Fang et al. . |
| 3,617,824 | 11/1971 | Shinoda et al. . |
| 3,749,987 | 7/1973 | Anantha . |
| 3,935,586 | 1/1976 | Landheer et al. . |
| 4,099,260 | 7/1978 | Lynes et al. . |
| 4,139,880 | 2/1979 | Ulmer et al. . |
| 4,139,935 | 2/1979 | Bertin et al. . |
| 4,246,502 | 1/1981 | Kabinel . |
| 4,423,456 | 12/1983 | Zaidenweber . |
| 4,533,988 | 8/1985 | Daly et al. . |
| 4,680,601 | 7/1987 | Mitlehner et al. . |
| 4,745,395 | 5/1988 | Robinson . |
| 4,777,580 | 10/1988 | Bingham . |
| 4,811,065 | 3/1989 | Cogan . |
| 4,857,985 | 8/1989 | Miller . |
| 4,875,151 | 10/1989 | Ellsworth et al. . |
| 4,903,189 | 2/1990 | Ngo et al. . |
| 5,038,266 | 8/1991 | Callen et al. . |
| 5,101,254 | 3/1992 | Hamana . |
| 5,109,256 | 4/1992 | De Long . |
| 5,132,749 | 7/1992 | Nishibayashi et al. . |
| 5,144,547 | 9/1992 | Masamoto . |
| 5,184,198 | 2/1993 | Bartur . |
| 5,258,640 | 11/1993 | Hsieh et al. . |
| 5,268,833 | 12/1993 | Axer . |
| 5,296,406 | 3/1994 | Readdie et al. . |
| 5,349,230 | 9/1994 | Shigekane . |
| 5,365,102 | 11/1994 | Mehrotra et al. . |
| 5,430,323 | 7/1995 | Yamazaki et al. . |
| 5,469,103 | 11/1995 | Shigekane . |
| 5,510,641 | 4/1996 | Yee et al. . |

OTHER PUBLICATIONS

U.S. Statutory Invention Registration No. H64, H. Maleis, May 1986.

*Primary Examiner*—Stephen Meier
*Attorney, Agent, or Firm*—Blakely, Sokoloff, Taylor & Zafman LLP

[57] ABSTRACT

Semiconductor diodes having a low forward voltage conduction drop, a low reverse leakage current and a high voltage capability suitable for use in integrated circuits as well as for discrete devices. The semiconductor diodes are fabricated as field effect devices having a common gate and drain connection by a process which provides very short channels, shallow drain regions and longitudinally graded junctions. Continuation of the gate/drain contact layer over specially located, tapered edge field oxide maximizes the breakdown voltage of the devices. The preferred fabrication technique utilizes four masking steps, all without any critical mask alignment requirements. Various embodiments are disclosed.

27 Claims, 6 Drawing Sheets

SEMICONDUCTOR DIODES HAVING LOW FORWARD CONDUCTION VOLTAGE DROP AND LOW REVERSE CURRENT LEAKAGE

BACKGROUND OF THE INVENTION

1. Field of the Invention

The present invention relates to the field of semiconductor devices and methods of fabricating the same.

2. Prior Art

Semiconductor devices of various kinds are well known in the prior art. The present invention relates to methods of fabricating semiconductor diodes and the diodes so fabricated, though the methods are also directly applicable to the fabrication of transistors as well. Because of the emphasis on diodes herein, only the prior art relating thereto will be discussed.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor device can substantially reduce the efficiency of the converter. For instance, the newer integrated circuits commonly used in computer systems are going to lower and lower operating voltages, such as currently 3.3 volts, 3 volts and as low as 2.7 volts. In a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications would require the use of a discreet diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discreet form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

SUMMARY OF THE INVENTION

Semiconductor diodes having a low forward voltage conduction drop, a low reverse leakage current and a high voltage capability suitable for use in integrated circuits as well as for discrete devices are disclosed. The semiconductor diodes are fabricated as field effect devices having a common gate and drain connection by a process which provides very short channels, shallow drain regions and longitudinally graded junctions. Continuation of the gate/drain contact layer over specially located, tapered edge field oxide maximizes the breakdown voltage of the devices. The preferred fabrication technique utilizes four masking steps, all without any critical mask alignment requirements. Various embodiments are disclosed.

DETAILED DESCRIPTION OF THE PRESENT INVENTION

Figure 1:
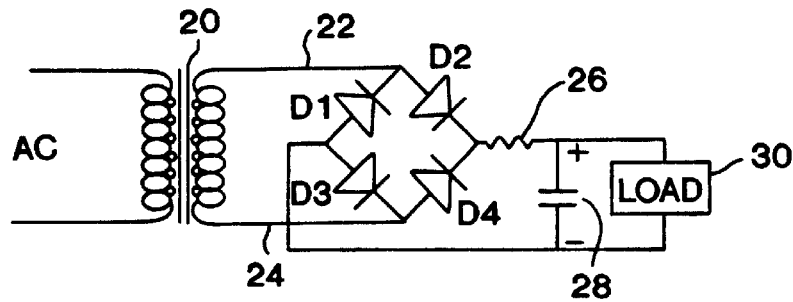
FIG. 1 is a circuit diagram for a well known AC to DC converter using a full wave bridge rectifier in which the present invention may be used.

First referring to FIG. 1, a circuit diagram for a well known AC to DC converter using a full wave bridge rectifier in which the present invention may be used may be seen. In such circuits, a transformer 20 is used to provide DC isolation between the primary and secondary circuits and frequently to provide an AC voltage step-up or step-down to the full wave bridge, comprised of diodes D1, D2, D3 and D4. When the secondary lead 22 is sufficiently positive with respect to secondary lead 24, diode D2 will conduct through resister 26 to charge or further charge capacitor 28 and to provide current to load 30, which current returns to lead 24 of the transformer through diode D3. Similarly, during the other half cycle of the AC input voltage, when the voltage on secondary lead 24 is sufficiently positive with respect to secondary lead 22, diode D4 will conduct to provide current through resistor 26 to charge capacitor 28 and to provide current to load 30, with the capacitor and load currents being returned to the secondary lead 22 through diode D1. Thus it may be seen that each time current is delivered from the full wave bridge of diodes D1 through D4 to the output of the bridge, two diode voltage drops are imposed in series with that output. Further, since any pair of diodes conduct only when the voltage across the secondary of the transformer 20 exceeds the voltage across capacitor 28 by two diode voltage drops, it is clear that current is delivered to the output of the bridge only during a fraction of the time, namely when the transformer secondary voltage is at or near a positive or negative peak.

The circuit of FIG. 1 is merely exemplary of the type of circuit in which the present invention is intended to be used. These circuits may be characterized as circuits wherein the diode will be subjected to both positive (forward) and negative (reverse) differential voltages across the two diode connections and the function of the diode is a rectifying function to provide a DC or rectified current output. This is to be distinguished from applications wherein the desired function of a diode is to provide a voltage reference responsive to the forward conduction voltage drop characteristic of the diode when conducting current, whether or not the diode will be subjected to negative differential voltages also when in use. These circuits may also be characterized as circuits wherein the diode or diodes will be subjected to both positive and negative differential voltages across the diode connections and the function of the diode or diodes is a power rectifying function to provide a DC or rectified current output of sufficient power level to power one or more circuits connected thereto. This is to be distinguished from applications wherein the desired function of the diode is to provide a signal-level current output which is used or processed in a subsequent circuit not powered by the DC or rectified current output of the diodes.

Figure 2A:
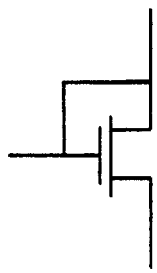
FIGS. 2a and 2b illustrate diode connected field effect devices, shown schematically in as n-channel and p-channel diode connected field effect devices, in accordance with the present invention.
Figure 2B:
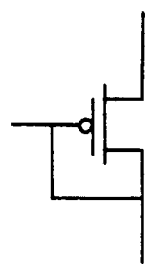

In many circuits of the type shown in FIG. 1, a linear voltage regulator may be used in the output in addition to smoothing capacitor 28. Further, resistor 26, which serves as a current limiting resistor, may be eliminated as a separate circuit component in favor of the secondary resistance of the transformer, as the transformer, in substantially all applications of interest, will be an actual discrete component of sufficient size to dissipate the power loss therein. Of particular importance to the present invention, however, are the diodes D1 through D4 themselves, as the power loss in these diodes in general serves no desired circuit function, but rather merely creates unwanted power dissipation and heat, requiring the use of larger diodes, whether in discrete form or integrated circuit form, and actually increases the size of the transformer required to provide this extra power output, e.g., the power required by the load plus the power dissipated by the diodes. The present invention is directed to the realization of diodes and/or diode functions having low diode forward conduction voltage drops, low reverse current leakage, and high voltage capabilities for use primarily in such circuits and other circuits wherein the diodes are in fact subjected to forward and reverse bias in use. This is achieved in the present invention through the use of diode connected field effect devices, shown schematically in FIGS. 2a and 2b as n-channel and p-channel diode connected field effect devices, respectively. In accordance with the preferred embodiment of the invention, such devices are fabricated through the use of common gate and drain connections, typically a common conducting layer on the substrate, and more preferably through one or more special fabrication techniques which enhance the electrical characteristic of the resulting device.

Figure 3A:
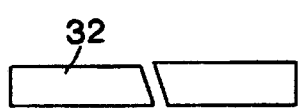
FIGS. 3a through 3v illustrate steps in an exemplary process for fabricating a preferred embodiment of the present invention.
Figure 3B:
FIGS. 3w and 3x illustrate steps in an alternate process for fabricating the present invention.
Figure 3C:
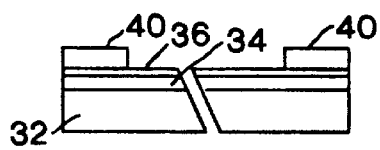
Figure 3D:
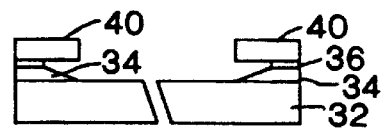
Figure 3E:
Figure 3F:
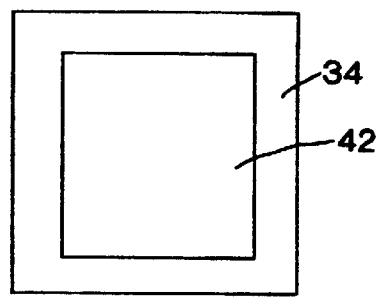
Figure 3G:
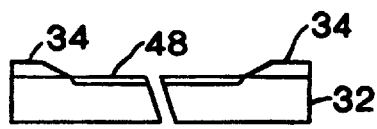
Figure 3H:
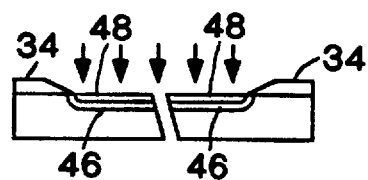
Figure 3I:
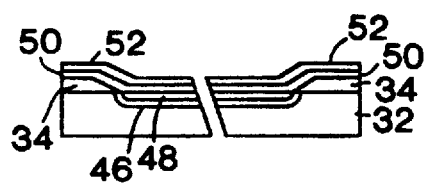
Figure 3J:
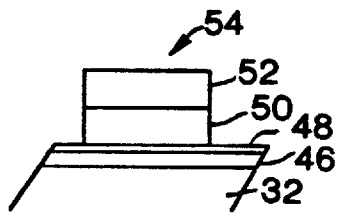
Figure 3K:
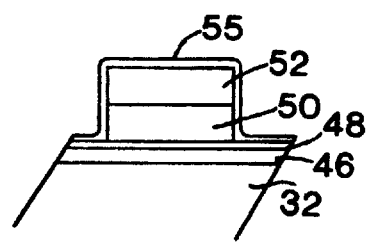
Figure 3L:
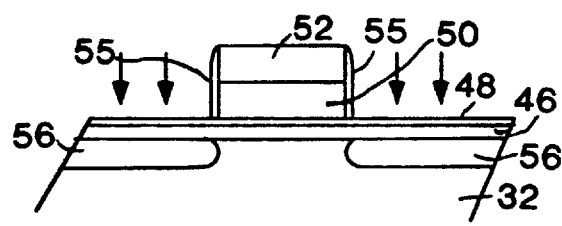
Figure 3M:
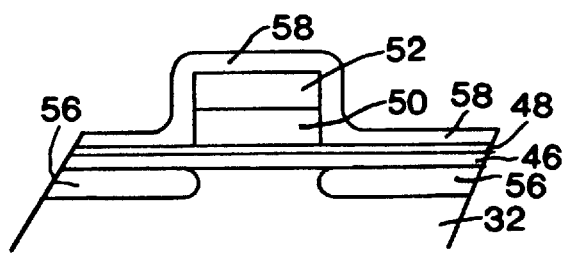
Figure 3N:
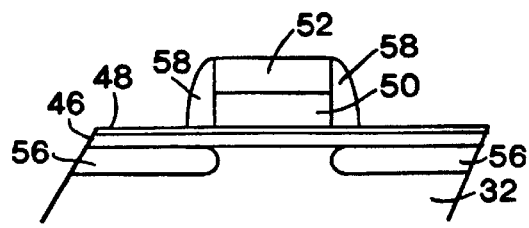
Figure 3O:
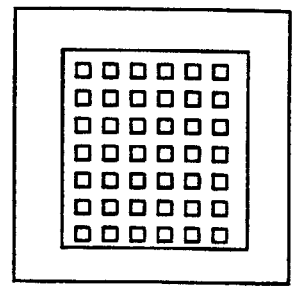
Figure 3P:
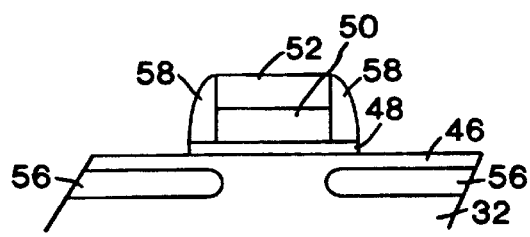
Figure 3Q:
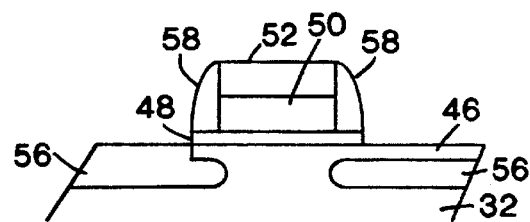
Figure 3R:
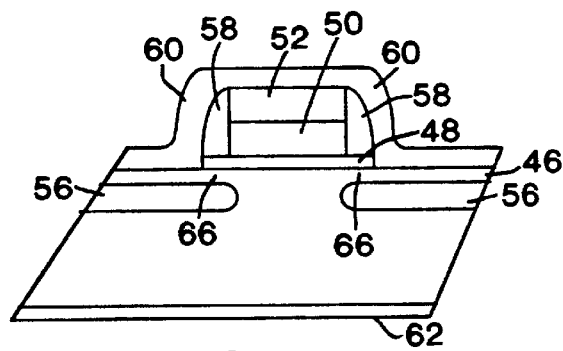
Figure 3S:
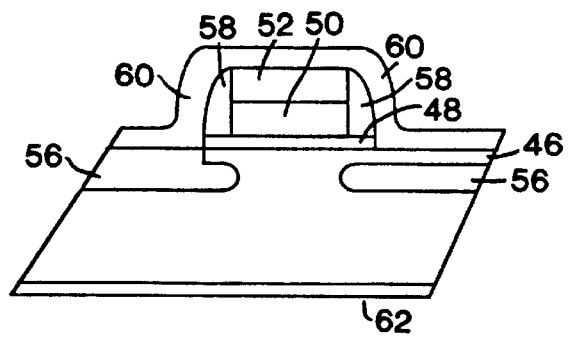
Figure 3T:
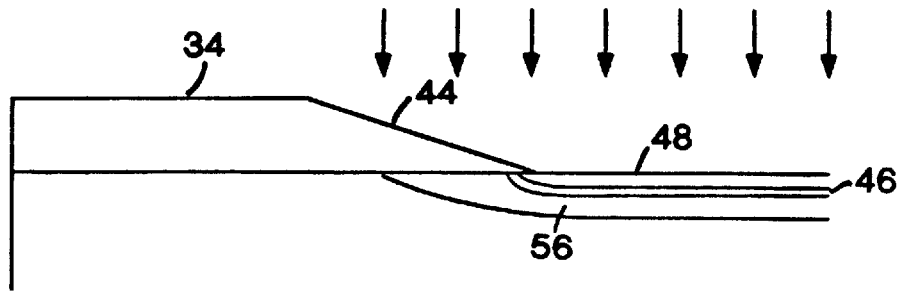
Figure 3U:
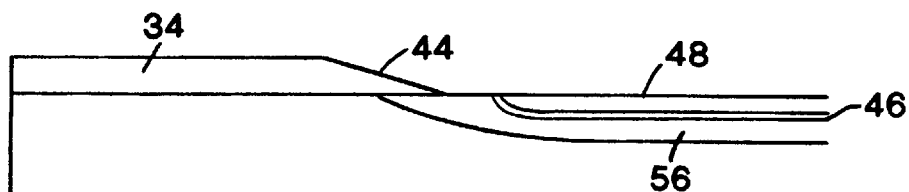
Figure 3V:
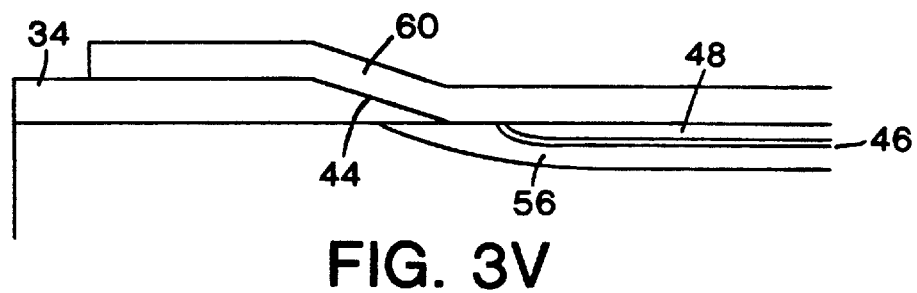

A process for fabricating a preferred embodiment of the present invention is presented herein in relation to FIGS. 3a through 3v. FIG. 3a illustrates a silicon substrate 32 which, in FIG. 3a and in some of the subsequent Figures, is taken as a chip sized substrate, though obviously numerous such chips are fabricated on a single silicon wafer, as is well known in the technology. In the specific embodiment described, the substrate is an n-type substrate. The first step is to grow a thick silicon oxide layer 34 as shown in FIG. 3b. Then, as shown in FIG. 3c, a thin oxide layer 36 is deposited, and a layer of photoresist 40 is put down and a window is defined therein within which the ultimate circuit will be formed. Then using a wet etch (FIG. 3d), both the thin and thick oxide regions will be etched. The thin oxide region, however, being a deposited region, will etch much more rapidly than the thick oxide region, allowing the etchant to undercut the photoresist 40 to form an opening 42 through the thick oxide having tapered sidewalls 44 thereon. Preferably, the tapered sidewalls have an aspect ratio on the order of 1 in 5 to 1 in 10. Thereafter, as shown in FIG. 3e, the photoresist is removed and, if desired, the thin oxide layer may also be removed. This defines a chip region (FIG. 3f) having an opening or window 42 through the thick oxide 34 to define the circuit area, the chip area shown in FIG. 3f of course being replicated many times on the silicon wafer.

In FIG. 3g, a thin oxide layer 48 is grown over the substrate region defined by the window in the thick oxide. This layer becomes the gate oxide, and preferably has a thickness of approximately 250 Angstroms. Then as shown in FIG. 3h, a thin n-type layer 46 such as, by way of example, an arsenic layer, is implanted through the gate oxide layer 48 throughout the substrate region defined by the window in the thick oxide. Preferably this layer is only approximately 200 Angstroms deep in the substrate, and terminates adjacent the lower (thin) edge of the tapered thick oxide because of the shielding effect thereof. (This may be also seen in FIG. 3t, taken on an expanded scale in comparison to FIG. 3g.) Then, as shown in FIG. 3i, a layer of nitride 50 and a layer of polysilicon 52 is put down thereover. The nitride layer 50 and the polysilicon layer 52 are patterned to form a plurality of pedestals, generally indicated by the numeral 54 in FIG. 3j. These pedestals may be any convenient shape, such as, by way of example, circular, hexagonal, rectangular or square. In that regard, in the embodiment being described, the pedestals are approximately 1 micron square and arranged in a two dimensional array, whereby a typical circuit may have on the order of 1.2 million such pedestals. An alternate embodiment, however, may use rectangular pedestals of say approximately 1 micron wide, but having a length of many microns, so that the number of pedestals across one dimension of the circuit are far fewer (as few as one) than the number of pedestals across a second dimension of the circuit. In any event, the pedestals are formed by putting down a layer of photoresist, patterning the same, and then plasma etching, so that the pedestals will have substantially straight (vertical) sidewalls, as opposed to somewhat tapered sidewalls typically provided by wet etching.

Alternatively, the pedestals may be fabricated of other materials, such as by way of example, depositing a nitride, oxide, nitride sandwich of layers rather than the polysilicon layer. The pedestals may be entirely nonconductive, or alternatively, if they have a conductive layer, should be insulated from the substrate thereunder. Thus the thin oxide layer under the pedestals of this embodiment may be considered part of the pedestals themselves, separate and apart from the thin oxide of the same layer extending over the region between pedestals. For instance, an equivalent structure may be fabricated by first forming the pedestals by forming one or more layers on the substrate, at least the first of which is a dielectric (electric insulator) such as an oxide or a nitride, and then etching the layer or layers as described to form the substantially vertical walled pedestals, exposing the substrate between pedestals. Then a thin oxide layer could be grown in the region between pedestals.

Then, as shown in FIG. 3k, a thin layer of material 55 such polysilicon or an oxide is deposited, preferably approximately 1000 Angstroms thick. Because this is a deposited layer, the layer will have approximately the same build-up on all surfaces, whether horizontal or vertical. In a subsequent plasma etch, however, the layer will be removed substantially equally, but only in the vertical direction. Thus, a subsequent plasma etch of 1000 Angstroms will remove the layer from the horizontal surfaces but leave regions 55 on the sides of the pedestals, each approximately 1000 Angstroms thick, as may be seen in FIG. 3n.

The next step, shown in FIG. 3l, is to implant $p^+$ regions 56 through the thin oxide 48 and deep enough in the silicon substrate 32 to not convert the n region 46 of FIG. 3g to a p region, but to place a $p^+$ region immediately there below. Typically this $p^+$ region will be on the order of 2000 Angstroms thick, in the preferred embodiment formed by the implantation of boron. Because of this thickness (reflected in the energy of the ion implant), part of the region under the tapered thick oxide region (see FIG. 3t) will also be implanted, forming a longitudinally graded junction between the $p^+$ implanted region and the n-type substrate. This graded junction is characterized by a gentle curve of the resulting pn junction from the already shallow junction to the substrate surface under the tapered thick oxide 44, typically on the order of one half way up the taper.

After the implant, the thin regions 55 are removed by etching. To best accommodate the removal of thin regions 55, it is convenient to use a different material for regions 55 than was used for the pedestals so that a selective etch may be used to remove all traces of the thin regions 55 without effecting the pedestals.

Then, as shown in FIG. 3m, a layer of polysilicon 58 is deposited, this time preferably approximately 0.5 microns thick. Again, because this is a deposited layer, the polysilicon will have approximately the same build-up on all surfaces, whether horizontal or vertical. In a subsequent plasma etch, however, the polysilicon will be removed substantially equally, but only in the vertical direction. Thus, a subsequent plasma etch of 0.5 microns will remove the polysilicon from the horizontal surfaces but leave polysilicon regions 58 on the sides of the pedestals, as may be seen in FIG. 3n.

Again, alternatively other materials may be used, such as, by way of example, by putting down a layer of silicide approximately 250 Angstroms thick followed by a oxide approximately 250 Angstroms thick, instead of the polysilicon (silicides are usually thinner and normally would require a suitable spacer material such as polysilicon or oxide to achieve the desired thickness).

At this stage of fabrication, the circuit appears generally as shown in the schematic representation of FIG. 3o. As stated before, in this exemplary embodiment, square pedestals are being used so that within the window of the tapered thick oxide (see FIG. 3e) there is a two dimensional array of a multitude of substantially square pedestals. As previously mentioned, alternatively the pedestals may have a substantial length in one dimension though will be small in the other dimension, being approximately 1 micron in the smaller (or both) dimensions in the presently preferred embodiments.

The next step in the fabrication, shown in FIG. 3p, is to etch away the thin oxide everywhere except as masked by the pedestals. As part of this etch, or as a separate etch, the thick oxide 34 is given a controlled etch to shift the end of the tapered region 44 (FIG. 3t) back approximately half way to the pn junction at the surface of the silicon substrate (FIG. 3u). Also, using a photo-resist mask, boron is implanted in a small percentage of the total area of the circuit to convert the corresponding part of the n-type region 46 to a $p^+$ region 56 to allow electrical contact to the $P^+$ region thereunder as shown in FIG. 3q. The purpose of electrically connecting to the $p^+$ region 56 in limited areas is to provide an opportunity to determine the voltage thereof, as otherwise the $p^+$ region would be a floating region. Since the pn junction between the $p^+$ region and the surrounding n regions will always be back biased, the $p^+$ region 56 is not a current carrying region, and accordingly the area of such contacts can be purposely kept small in comparison to the area of contact to be made to the n region 46 thereover most of the circuit. In that regard, note also that while the Figures such as FIG. 3p show the $p^+$ regions 56 separated from each other by the pedestals, the $p^+$ regions are interconnected between pedestals as suggested by FIG. 3o, so that the $p^+$ region 56 is a single region perforated with an array of openings, one at each pedestal.

Finally, one or more interconnect layers 60 are deposited over the circuit in the window 42 on the substrate (FIG. 3f), as well as over the tapered region 44 on the thick oxide (see FIG. 3v). This interconnect layer makes electrical contact with n region 46 over most of the area of the circuit (FIG. 3r) and in a small percentage of the circuit area, makes electrical contact with the p+ diffused regions 56 (FIG. 3s). The interconnect layer may be a single layer or a plurality of layers such as polysilicon, a silicide and/or metal layers. The interconnect layer forms the anode of the resulting diode, interconnecting the polysilicon gate region 58 (and nitride regions 50 and polysilicon regions 42) with drain regions 46 (FIG. 3r) and p+ regions 56 (FIG. 3s). The source connection is made from the back of the substrate through metallized layer 62 (FIGS. 3r and 3s). Between drain regions 46 and source regions 64 are very short channel regions 66, defined primarily by the approximately 0.5 micron wide polysilicon region 58 during fabrication of the device.

By appropriate selection of dopants and their concentrations, and other materials and dimensions of the device, the channel regions may be made to be just conducting at a zero forward bias. In such a case, simulations have shown that forward biasing of the device by applying a positive voltage to contact layer 60 with respect to contact layer 62 of something less than two tenths of a volt will provide a forward current of at least two orders of magnitude greater than the reverse bias leakage current. The simulations also show that a forward bias on the order of three tenths of a volt provides a forward current flow of at least three orders of magnitude greater than the reverse bias leakage current. Thus, in true rectifying applications such as in power supplies and the like, the present invention will clearly result in reduced power consumption and heating in the rectifying devices, and greater overall efficiency of the resulting circuits.

Figure 4:
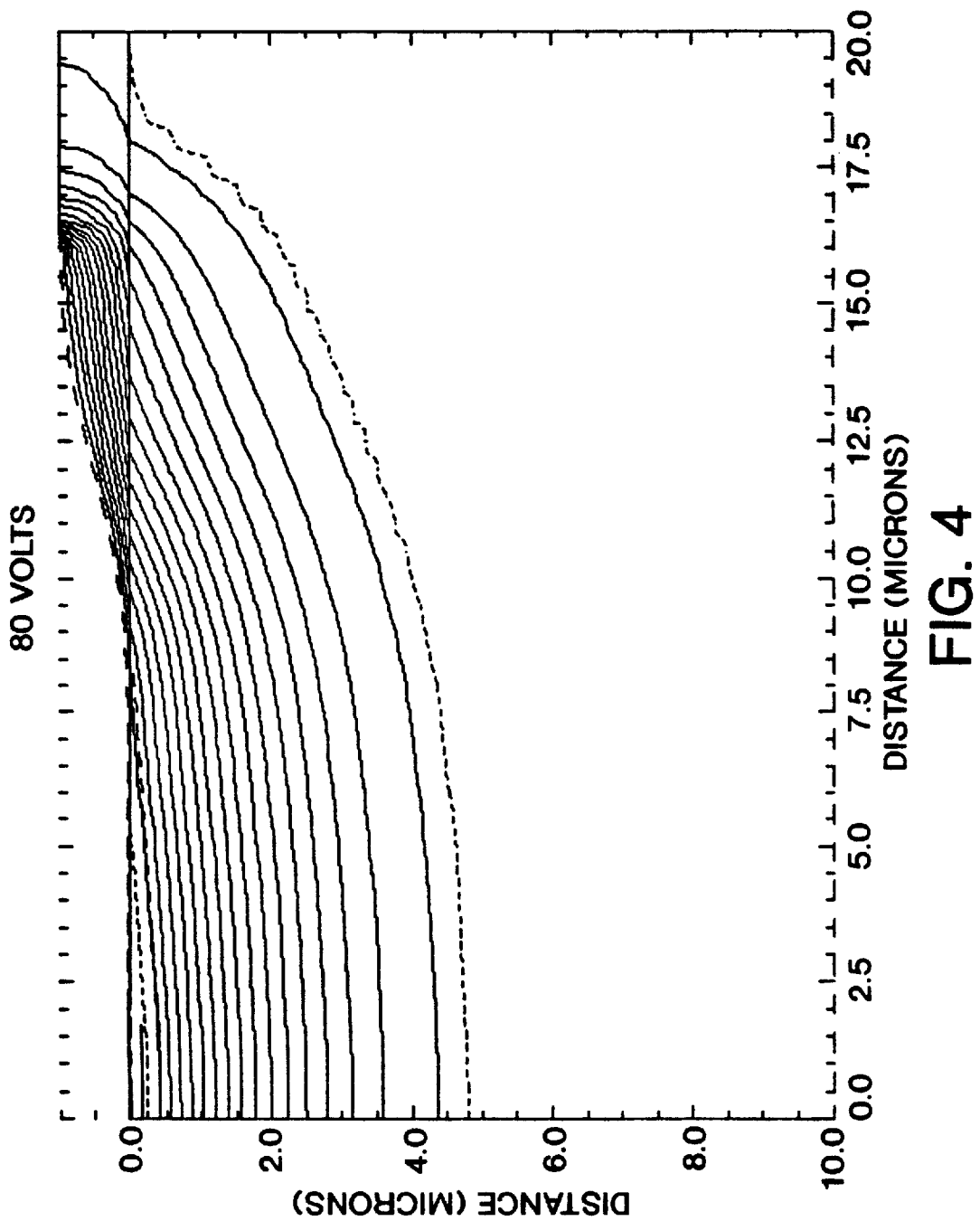
FIG. 4 is a reproduction of a computer simulation of the field lines on both sides of the pn junction and in the oxide when the preferred embodiment of the present invention is subjected to a reverse bias of 80 volts.

With respect to the reverse bias breakdown voltage of the resulting diode, the reverse bias voltage appears between p+ region 56 and the n-type substrate 32 (see FIG. 3v). The shallow curvature of the p+ region 56 adjacent the edges thereof, resulting from the longitudinally graded junction fabrication technique herein before described, avoids concentration of the field lines in that area. Similarly, the extension of the upper interconnect layer 60 over the tapered region 44 of the thick oxide 34 in effect tends to continue the lines of equipotential, without concentration, out of the substrate into the silicon oxide. This is illustrated in FIG. 4, which is a reproduction of a computer simulation of the field lines on both sides of the pn junction and in the oxide when the device is subjected to a reverse bias of 80 volts. While the field lines tend to concentrate once in the silicon oxide, the silicon oxide is characterized by a higher breakdown voltage than the silicon substrate. In the substrate, however, there is very little concentration of the field lines, giving the device a reverse bias breakdown voltage closely approaching the inherent reverse bias breakdown voltage of the silicon substrate itself. This effect is maximized by bringing the end of the taper of the thick oxide 44 back approximately half way to the pn junction formed between p+ region 56 and the n-type substrate where the pn junction meets the surface of the substrate. However an advantageous effect can still be achieved with the graded junction of the present invention by omitting the step of giving a controlled etch of the thick oxide 34 to shift the end of the tapered region 44 (FIG. 3t) back toward the pn junction at the surface of the silicon substrate (FIG. 3u). This still substantially reduces the concentration of field lines in the substrate over other known techniques, both because of the better longitudinal gradation of the junction, and the tapered spacing of what amounts to a field plate over the tapered thick oxide.

In the fabrication of the device just described, in general four masks are used. The first is to pattern the photoresist 40 (FIG. 3c), which in effect defines the location of the substrate window surrounded by the tapered thick oxide. This alignment is of course not critical. The second mask is the pedestal mask, which defines the positions of the pedestals within the window. Because of the spacing provided between the outer pedestals and the tapered thick oxide, and the absence of any other specific alignment requirements, alignment of the pedestal mask with respect to the first mask is also not critical. The third mask is a mask defining the small percentage of the circuit area over which the arsenic implant region will implanted with boron to make electrical contact with the boron implanted p+ region thereunder. Since it doesn't matter where on the circuit this occurs, the positioning of this mask with respect to either of the prior two masks is also not critical. Finally, the mask which defines the sheet serving as the interconnect layer also simultaneously defines the integral field plate layer extending up over the tapered thick oxide. Here again, this alignment is also not critical with respect to the location of any of the three prior masks. Accordingly, there are no critical mask alignment requirements with respect to the fabrication technique herein before described, so that relatively crude alignment may be used in comparison to that generally required for the processing of conventional devices.

Figure 3W:
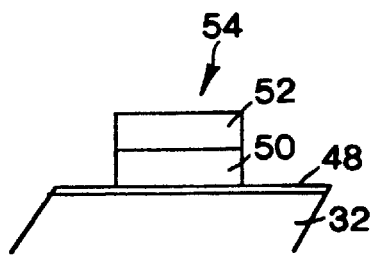
Figure 3X:
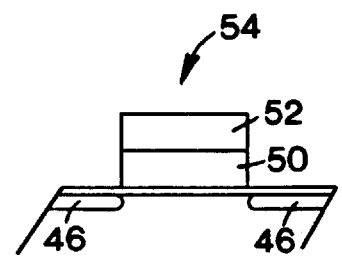

In the foregoing description, the n-type layer 46 (FIG. 3h) was implanted after the thin oxide layer 48 was grown. As an alternative, the n-type implant may be done instead after the pedestals are formed (FIG. 3j). In this case, before the implant the pedestal regions would appear as shown in FIG. 3w, and after the implant the pedestal regions would appear as shown in FIG. 3x. Obviously the Figures following FIG. j would be correspondingly changed also.

Figure 5A:
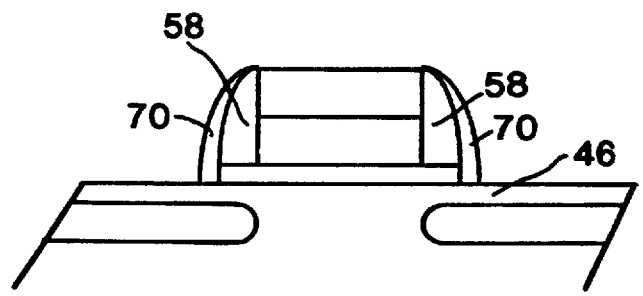
FIGS. 5a through 5c illustrate a further exemplary alternate method of fabrication for the present invention.
Figure 5B:
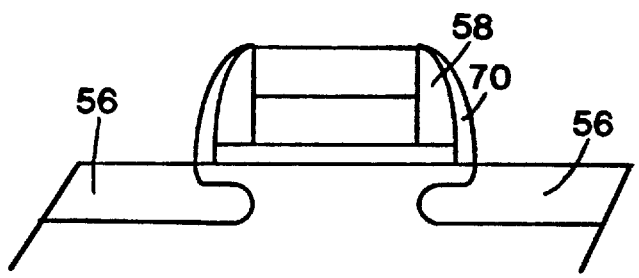
Figure 5C:
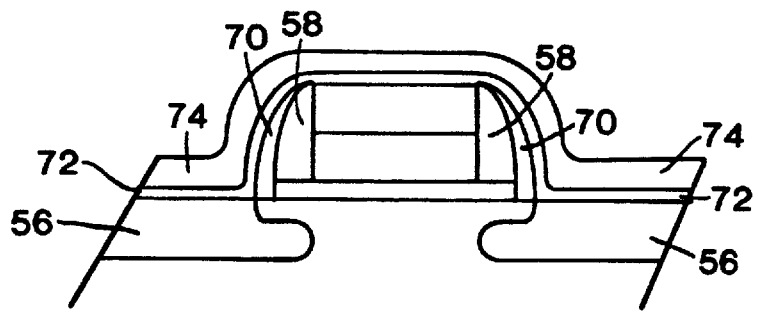

A further alternate method of fabrication for the present invention may be seen in FIGS. 5a through 5c. In FIG. 5a, after the structure of FIG. 3p has been formed, a layer of titanium nitride (TiN) is deposited and plasma etched to leave TiN side regions 70, electrically connecting the side regions 58 forming the gate regions to the substrate region 46. Then a further boron implant is made to extend the p+ regions to the surface of the substrate, as shown in FIG. 5b. Finally, a further conductive layer or layers are deposited, such as Tin layer 72 and tungsten silicide layer 74 shown in FIG. 5c. In this process, the TiN sidewall regions 70 provide good electrical connection of the gate regions 58 and the substrate, allowing the use of the rest of the substrate area between pedestals to be converted to P+. This eliminates one masking step, namely that used to convert a small percentage of the substrate area between pedestals (FIG. 5p) to a p+ regions (FIG. 3q). While that masking step is not critical in alignment, its elimination is a simplification of the process. In that regard, note that, as an example, the boron implanting is over the entire area without masking the pedestals, as any implantation on the pedestal sidewalls or tops is of no consequence.

In certain instances in the foregoing description, certain alternate materials and methods were set forth. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention diodes and methods of fabricating the same may be varied without departing from the spirit and scope of the invention.

What is claimed is:

1. A pn junction having a high reverse voltage breakdown voltage comprising:

a first region of a first conductivity type having a first surface;

a second region of a second conductivity type formed in the first region so that a pn junction is formed between the first and second regions, an edge of the pn junction having a longitudinally graded junction;

an oxide layer disposed over the first region adjacent the edge of the pn junction, the oxide layer being tapered to a minimum thickness adjacent the edge of the pn junction at the first surface; and, a conductive layer over the second region and extending over the tapered oxide layer.

2. The pn junction of claim 1 wherein the second region is an ion implanted region formed by the implantation of ions in a window in a thick oxide, the window having tapered edges defining the second region, the implantation through the tapered edges of the oxide forming the longitudinally graded junction.

3. The pn junction of claim 2 wherein the conductive layer over the second region and extending over the tapered oxide layer is a conductive layer over the window in the thick oxide and over the tapered edges through which the implantation was made forming the longitudinally graded junction.

4. The pn junction of claim 2 wherein the conductive layer over the second region and extending over the tapered oxide layer is a conductive layer over the window in the thick oxide and over tapered edges of the oxide layer after the tapered edges through which the implantation was made have been etched back.

5. The pn junction of claim 2 wherein the conductive layer over the second region and extending over the tapered oxide layer is a conductive layer over the window in the thick oxide and over tapered edges of the oxide layer after the tapered edges through which the implantation was made have been etched back approximately one half way to the position of the pn junction at the first surface of the first region.

6. A diode having first and second diode contacts comprising:

a semiconductor substrate of a first conductivity type having first and second surfaces and forming the first diode contact;

a plurality of pedestals on the first surface of the substrate;

a first oxide layer on the substrate between pedestals;

the pedestals having side regions thereon with a channel region in the substrate below the first oxide layer under the side regions and on the first surface of the substrate;

the substrate having a buried layer of a second conductivity type under and between the side regions; and, a conductive layer forming the second diode contact and electrically connecting the side regions on the pedestals and the substrate between the side regions.

7. The diode of claim 6 wherein the channel region has different electrical characteristics than the substrate.

8. The diode of claim 6 further comprising a second oxide layer on the substrate, the second oxide layer surrounding the area of the first surface of the substrate having the plurality of pedestals thereon and being tapered to a minimum thickness at an edge thereof facing the plurality of pedestals, the conductive layer forming the second diode contact extending over the tapered edge of the second oxide layer, the buried layer extending to the first surface and terminating in the region of the tapered oxide.

9. The diode of claim 8 wherein the conductive layer is in electrical contact with the buried layer in selected regions between pedestals.

10. The diode of claim 9 wherein the taper of the second oxide layer has been moved back after the implant toward the junction between the buried layer and the substrate.

11. The diode of claim 8 wherein the buried layer is a layer implanted through the tapered oxide characterized by a longitudinally graded junction.

12. A diode having first and second diode contacts comprising:

a semiconductor substrate of a first conductivity type having first and second surfaces and forming the first diode contact;

a plurality of pedestals on the first surface of the substrate;

a first oxide layer on the substrate between pedestals;

the pedestals having side regions thereon with a channel region in the substrate below the first oxide layer under the side regions and on the first surface of the substrate;

the substrate having a buried layer of a second conductivity type under and between the side regions;

a conductive layer forming the second diode contact and electrically connecting the side regions on the pedestals and the substrate between the side regions;

a second oxide layer on the substrate, the second oxide layer surrounding the area of the first surface of the substrate having the plurality of pedestals thereon and being tapered to a minimum thickness at an edge thereof facing the plurality of pedestals, the conductive layer forming the second diode contact extending over the tapered edge of the oxide, the buried layer extending to the first surface and terminating in the region of the tapered oxide;

the conductive layer being in electrical contact with the buried layer in selected regions between pedestals.

13. The diode of claim 12 wherein the buried layer is a layer implanted through the tapered oxide characterized by a longitudinally graded junction.

14. The diode of claim 13 wherein the taper of the second oxide layer has been moved back after the implant to toward the junction between the buried layer and the substrate.

15. The diode of claim 12 wherein the channel region has different electrical characteristics than the substrate.

16. A rectifying circuit having first and second diode connections comprising:

a circuit wherein a diode is subjected to positive and negative differential voltages between the first and second diode connections to provide a rectified output;

the diode having source, gate and drain regions, the drain and gate regions being electrically interconnected by a common conductive layer forming the first diode connection, a semiconductor substrate of a first conductivity type having first and second surfaces and forming one of the diode connections;

a plurality of pedestals on the first surface of the substrate;

a first oxide layer on the substrate between pedestals;

the pedestals having side regions thereon with a channel region in the substrate below the first oxide layer under the side regions and on the first surface of the substrate;

the substrate having a buried layer of a second conductivity type under and between the side regions; and, a conductive layer forming the other diode connection and electrically connecting the side regions on the pedestals and the substrate between the side regions.

17. The rectifying circuit of claim 16 wherein the substrate forms the second diode connection.

18. The rectifying circuit of claim 16 wherein the circuit wherein the diode is subjected to positive and negative differential voltages between the first and second diode connections is a circuit to provide a power-level rectified output.

19. The rectifying circuit of claim 16 wherein the channel region has different electrical characteristics than the substrate.

20. The rectifying circuit of claim 16 further comprising a second oxide layer on the substrate, the second oxide layer surrounding the area of the first surface of the substrate having the plurality of pedestals thereon and being tapered to a minimum thickness at an edge thereof facing the plurality of pedestals, the conductive layer extending over the tapered edge of the second oxide layer, the buried layer extending to the first surface and terminating in the region of the tapered oxide.

21. The rectifying circuit of claim 20 wherein the conductive layer is in electrical contact with the buried layer in selected regions between pedestals.

22. The rectifying circuit of claim 20 wherein the buried layer is a layer implanted through the tapered oxide characterized by a longitudinally graded junction.

23. The rectifying circuit of claim 22 wherein the taper of the second oxide layer has been moved back after the implant to toward the junction between the buried layer and the substrate.

24. A rectifying circuit having first and second diode connections comprising:
    a circuit wherein the diode is subjected to positive and negative differential voltages between the first and second diode connections to provide a rectified output;
    the diode having source, gate and drain regions, the drain and gate regions being electrically interconnected by a common conductive layer forming the first diode connection;
    the diode having:
        a semiconductor substrate of a first conductivity type having first and second surfaces and forming one of the diode connections;
        a plurality of pedestals on the first surface of the substrate;
        a first oxide layer on the substrate between pedestals;
        the pedestals having side regions thereon with a channel region in the substrate below the first oxide layer under the side regions and on the first surface of the substrate;
        the substrate having a buried layer of a second conductivity type under and between the side regions;
        a conductive layer forming the other diode connection and electrically connecting the side regions on the pedestals and the substrate between the side regions;
        a second oxide layer on the substrate, the second oxide layer surrounding the area of the first surface of the substrate having the plurality of pedestals thereon and being tapered to a minimum thickness at an edge thereof facing the plurality of pedestals, the conductive layer extending over the tapered edge of the oxide, the buried layer extending to the first surface and terminating in the region of the tapered oxide;
        the conductive layer being in electrical contact with the buried layer in selected regions between pedestals.

25. The rectifying circuit of claim 24 wherein the buried layer is a layer implanted through the tapered oxide characterized by a longitudinally graded junction.

26. The rectifying circuit of claim 25 wherein the taper of the second oxide layer has been moved back after the implant to toward the junction between the buried layer and the substrate.

27. The rectifying circuit of claim 24 wherein the channel region has different electrical characteristics than the substrate.

* * * * *

(12) EX PARTE REEXAMINATION CERTIFICATE (9048th)
United States Patent
Metzler et al.

(10) Number: US 5,825,079 C1
(45) Certificate Issued: Jun. 5, 2012

(54) SEMICONDUCTOR DIODES HAVING LOW FORWARD CONDUCTION VOLTAGE DROP AND LOW REVERSE CURRENT LEAKAGE

(75) Inventors: Richard A. Metzler, Mission Viejo, CA (US); Vladimir Rodov, Redondo Beach, CA (US)

(73) Assignee: Integrated Discrete Devices, LLC, Costa Mesa, CA (US)

Reexamination Request:
No. 90/009,655, Dec. 18, 2009

Reexamination Certificate for:
Patent No.: 5,825,079
Issued: Oct. 20, 1998
Appl. No.: 08/787,627
Filed: Jan. 23, 1997

(51) Int. Cl.
*H01L 29/06* (2006.01)
*H01L 31/0352* (2006.01)

(52) U.S. Cl. ......................................... 257/653; 257/393
(58) Field of Classification Search ..................... None
See application file for complete search history.

(56) References Cited

To view the complete listing of prior art documents cited during the proceeding for Reexamination Control Number 90/009,655, please refer to the USPTO's public Patent Application Information Retrieval (PAIR) system under the Display References tab.

*Primary Examiner* — Tuan H Nguyen

(57) ABSTRACT

Semiconductor diodes having a low forward voltage conduction drop, a low reverse leakage current and a high voltage capability suitable for use in integrated circuits as well as for discrete devices. The semiconductor diodes are fabricated as field effect devices having a common gate and drain connection by a process which provides very short channels, shallow drain regions and longitudinally graded junctions. Continuation of the gate/drain contact layer over specially located, tapered edge field oxide maximizes the breakdown voltage of the devices. The preferred fabrication technique utilizes four masking steps, all without any critical mask alignment requirements. Various embodiments are disclosed.

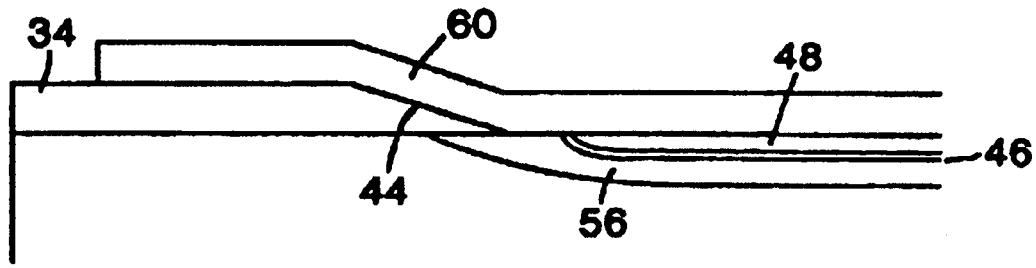

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claim 6 is cancelled.

Claims 1-5 and 7-27 were not reexamined.

* * * * *